US007975708B2

(12) United States Patent
Ravkin et al.

(10) Patent No.: US 7,975,708 B2
(45) Date of Patent: Jul. 12, 2011

(54) PROXIMITY HEAD WITH ANGLED VACUUM CONDUIT SYSTEM, APPARATUS AND METHOD

(75) Inventors: Michael Ravkin, Sunnyvale, CA (US); John M. de Larios, Palo Alto, CA (US); Fred C. Redeker, Fremont, CA (US); Mikhail Korolik, San Jose, CA (US); Erik M. Freer, Campbell, CA (US)

(73) Assignee: Lam Research Corporation, Fremont, CA (US)

( * ) Notice: Subject to any disclaimer, the term of this patent is extended or adjusted under 35 U.S.C. 154(b) by 1136 days.

(21) Appl. No.: 11/731,532

(22) Filed: Mar. 30, 2007

(65) Prior Publication Data

US 2009/0145464 A1 Jun. 11, 2009

(51) Int. Cl.
*B08B 3/00* (2006.01)

(52) U.S. Cl. ............... 134/94.1; 134/104.2; 134/172; 134/198

(58) Field of Classification Search ............ 134/94.1, 134/104.2, 172, 198
See application file for complete search history.

(56) References Cited

U.S. PATENT DOCUMENTS

| | | | |
|---|---|---|---|
| 3,953,265 A | 4/1976 | Hood | |
| 4,086,870 A | 5/1978 | Canavello et al. | |
| 4,367,123 A | 1/1983 | Beck | |
| 4,444,492 A | 4/1984 | Lee | |
| 4,838,289 A | 6/1989 | Kottman et al. | |
| 5,102,494 A | 4/1992 | Harvey et al. | |
| 5,180,431 A | 1/1993 | Sugimoto et al. | |

(Continued)

FOREIGN PATENT DOCUMENTS

EP 0 905 746 A1 3/1999

(Continued)

OTHER PUBLICATIONS

Owa et al. "*Immersion lithography; its potential performance and issues*", Proceedings of the SPIE, SPIE, Bellingham, VA, US, vol. 5040, No. 1, Feb. 28, 2003, pp. 724-733, XP002294500.

(Continued)

*Primary Examiner* — Michael Barr
*Assistant Examiner* — Jason Heckert
(74) *Attorney, Agent, or Firm* — Martine Penilla & Gencarella, LLP (57) ABSTRACT

A proximity head including a head surface. The head surface including a first flat region and a plurality of first conduits. Each one of the plurality of first conduits being defined by corresponding one of a plurality of first discrete holes. The plurality of first discrete holes residing in the head surface and extending through the first flat region. The head surface also including a second flat region and a plurality of second conduits. The plurality of second conduits being defined by a corresponding plurality of second discrete holes that reside in the head surface and extend through the second flat region. The head surface also including a third flat region disposed between and adjacent to the first flat region and the second flat region and a plurality of third conduits. The plurality of third conduits being defined by a corresponding plurality of third discrete holes that reside in the head surface and extend through the third flat region. The third conduits being formed at a first angle relative to the third flat region. The first angle being between 30 and 60 degrees. A system and method for processing a substrate with a proximity head is also described.

17 Claims, 7 Drawing Sheets

U.S. PATENT DOCUMENTS

| | | | |
|---|---|---|---|
| 5,271,774 A | 12/1993 | Leenaars et al. |
| 5,294,257 A | 3/1994 | Kelly et al. |
| 5,343,234 A | 8/1994 | Kuehnle |
| 5,361,449 A | 11/1994 | Akimoto |
| 5,472,502 A | 12/1995 | Batchelder |
| 5,558,111 A | 9/1996 | Lofaro |
| 5,601,655 A | 2/1997 | Bok et al. |
| 5,660,642 A | 8/1997 | Britten |
| 5,705,223 A | 1/1998 | Bunkofske |
| 5,709,757 A | 1/1998 | Hatano et al. |
| 5,807,522 A | 9/1998 | Brown et al. |
| 5,830,334 A | 11/1998 | Kobayashi |
| 5,882,433 A | 3/1999 | Ueno |
| 5,893,004 A | 4/1999 | Yamamura |
| 5,945,351 A | 8/1999 | Mathuni |
| 5,975,098 A | 11/1999 | Yoshitani et al. |
| 5,989,478 A | 11/1999 | Ouellette et al. |
| 5,997,653 A | 12/1999 | Yamasaka |
| 6,086,454 A | 7/2000 | Watanabe et al. |
| 6,092,937 A | 7/2000 | Snodgrass et al. |
| 6,103,636 A | 8/2000 | Zahorik et al. |
| 6,108,932 A | 8/2000 | Chai |
| 6,132,586 A | 10/2000 | Adams et al. |
| 6,214,513 B1 | 4/2001 | Cae et al. |
| 6,230,722 B1 | 5/2001 | Mitsumori et al. |
| 6,341,998 B1 | 1/2002 | Zhang |
| 6,391,166 B1 | 5/2002 | Wang |
| 6,398,975 B1 | 6/2002 | Mertens et al. |
| 6,417,117 B1 | 7/2002 | Davis |
| 6,433,541 B1 | 8/2002 | Lehman et al. |
| 6,446,358 B1 | 9/2002 | Mitsumori et al. |
| 6,474,786 B2 | 11/2002 | Percin et al. |
| 6,488,040 B1 | 12/2002 | De Larios et al. |
| 6,491,764 B2 | 12/2002 | Mertens et al. |
| 6,495,005 B1 | 12/2002 | Colgan et al. |
| 6,514,570 B1 | 2/2003 | Matsuyama et al. |
| 6,530,823 B1 | 3/2003 | Goodarz et al. |
| 6,531,206 B2 | 3/2003 | Johnston et al. |
| 6,550,988 B2 | 4/2003 | Sugimoto et al. |
| 6,555,017 B1 | 4/2003 | Rushford et al. |
| 6,616,772 B2 | 9/2003 | De Larios et al. |
| 6,629,540 B2 | 10/2003 | Mitsumori et al. |
| 6,689,323 B2 | 2/2004 | Fisher et al. |
| 6,764,720 B2 | 7/2004 | Pui et al. |
| 6,799,584 B2 | 10/2004 | Yogev et al. |
| 6,851,435 B2 | 2/2005 | Mertens et al. |
| 6,854,473 B2 | 2/2005 | Hanson et al. |
| 6,954,993 B1 | 10/2005 | Smith et al. |
| 6,988,326 B2 | 1/2006 | O'Donnell et al. |
| 6,988,327 B2 | 1/2006 | Garcia et al. |
| 7,000,622 B2 | 2/2006 | Woods et al. |
| 7,069,937 B2 | 7/2006 | Garcia et al. |
| 2002/0121290 A1 | 9/2002 | Tang et al. |
| 2003/0091754 A1 | 5/2003 | Chihani et al. |
| 2003/0092264 A1 | 5/2003 | Shinji et al. |
| 2004/0060573 A1 | 4/2004 | Woods |
| 2004/0069319 A1 | 4/2004 | Boyd et al. |
| 2004/0069329 A1 | 4/2004 | De Larios et al. |
| 2004/0136494 A1 | 7/2004 | Lof et al. |
| 2004/0178060 A1 | 9/2004 | Ravkin et al. |
| 2004/0182422 A1 | 9/2004 | Boyd et al. |
| 2005/0132515 A1 | 6/2005 | Boyd et al. |
| 2005/0139318 A1 | 6/2005 | Woods et al. |
| 2005/0145265 A1 | 7/2005 | Ravkin et al. |
| 2005/0145267 A1 | 7/2005 | Korolik et al. |
| 2005/0145268 A1 | 7/2005 | Woods |
| 2005/0148197 A1 | 7/2005 | Woods et al. |
| 2005/0217703 A1 | 10/2005 | O'Donnell |
| 2006/0064895 A1 | 3/2006 | Garcia et al. |
| 2008/0314422 A1* | 12/2008 | O'Donnell et al. .......... 134/94.1 |

FOREIGN PATENT DOCUMENTS

| | | |
|---|---|---|
| EP | 0 905 747 A1 | 3/1999 |
| EP | 1 489 461 A1 | 12/2004 |
| EP | 1 489 462 A2 | 12/2004 |
| EP | 1 571 697 A1 | 9/2005 |
| EP | 1612845 * | 1/2006 |
| EP | 1 612 845 A2 | 4/2006 |
| JP | 05837190 | 3/1983 |
| JP | 62150828 A | 7/1987 |
| JP | 02280330 | 11/1990 |
| JP | 02309638 | 12/1990 |
| JP | 08277486 | 10/1996 |
| JP | 11031672 | 2/1999 |
| JP | 11350169 | 12/1999 |
| JP | 2003-151948 | 5/2003 |
| KR | 10-2006-0049726 A | 5/2006 |
| WO | WO 99/16109 A1 | 4/1999 |
| WO | WO 99/49504 | 9/1999 |
| WO | WO 02/01613 A3 | 1/2002 |
| WO | WO 02/32825 A1 | 4/2002 |
| WO | WO 02/101795 A3 | 12/2002 |
| WO | WO 03/014416 A2 | 2/2003 |
| WO | WO 2004/030051 A2 | 4/2004 |
| WO | WO 2004/030051 * | 8/2004 |

OTHER PUBLICATIONS

Lim et al., "*Atomic Layer deposition of transition metals*", Department of Chemistry and Chemical Biology, Harvard University, Nature Publishing Group, vol. 2, Nov. 2003, pp. 749-754.

ICKnowledge LLC, "*Technology Backgrounder: Atomic Layer Deposition*", ICKnowledge.com, 2004, pp. 1-7.

"*Chemical vapor deposition*", Wikipedia, the free encyclopedia, http://en.wikipedia.org/wiki/Chemical_vapor_deposition, 2005, p. 1-2.

Sigma-Aldrich, "*Atomic Layer Deposition (ALD)*", http://www.sigmaaldrich.com/Area_of_Interest/Chemistry/Materials_Science/Thin_Films, 2005, pp. 1-2.

J.A. Britten, "A moving-zone Marangoni drying process for critical cleaning and wet processing," Oct. 1997, *Solid State Technology*.

International Search Report—PCT/US2008/002414—Jul. 30, 2008 (4 pages).

* cited by examiner

PROXIMITY HEAD WITH ANGLED VACUUM CONDUIT SYSTEM, APPARATUS AND METHOD

CROSS REFERENCE TO RELATED APPLICATIONS

This application is related to co-pending and co-owned U.S. patent application Ser. No. 10/330,843, filed on Dec. 24, 2002 and entitled "MENISCUS, VACUUM, EPA VAPOR, DRYING MANIFOLD," which is incorporated herein by reference in its entirety for all purposes. This application is also related to co-pending and co-owned U.S. patent application Ser. No. 10/330,897, filed on Dec. 24, 2002 and entitled "SYSTEM FOR SUBSTRATE PROCESSING WITH MENISCUS, VACUUM, IPA VAPOR, DRYING MANIFOLD," which is incorporated herein by reference in its entirety for all purposes. This application is also related to co-pending and co-owned U.S. patent application Ser. No. 10/261,839, filed on Sep. 30, 2002 and entitled "METHOD AND APPARATUS FOR DRYING SEMICONDUCTOR WAFER SURFACES USING A PLURALITY OF INLETS AND OUTLES HELD IN CLOSE PROXIMITY TO THE WAFER SURFACES," which is incorporated herein by reference in its entirety for all purposes.

BACKGROUND

The present invention relates generally to semiconductor manufacturing processes, and more particularly, to methods and systems for processing semiconductors with a proximity head.

In the semiconductor chip fabrication process, it is well-known that there is a need to clean and dry a wafer where a fabrication operation has been performed that leaves unwanted residues on the surfaces of wafers. Examples of such a fabrication operation include plasma etching and chemical mechanical polishing (CMP). In CMP, a wafer is placed in a holder that pushes a wafer surface against a polishing surface. Slurry can include chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form spots). To prevent evaporation from taking place, the cleaning fluid must be removed as quickly as possible without the formation of droplets on the wafer surface.

In an attempt to accomplish this, one of several different drying techniques is employed, such as spin-drying and the like. These drying techniques utilize some form of a moving liquid/gas interface on a wafer surface that, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants and/or spots being left on the wafer surface.

In view of the forgoing, there is a need for drying technique that minimizes the effects of droplets on the surface of the substrate or substantially eliminates the formation of droplets on the surface of the substrate.

SUMMARY

Broadly speaking, the present invention fills these needs by providing an improved proximity head. It should be appreciated that the present invention can be implemented in numerous ways, including as a process, an apparatus, a system, computer readable media, or a device. Several inventive embodiments of the present invention are described below.

One embodiment provides a proximity head including a head surface. The head surface including a first flat region and a plurality of first conduits. Each one of the plurality of first conduits being defined by corresponding one of a plurality of first discrete holes. The plurality of first discrete holes residing in the head surface and extending through the first flat region. The head surface also including a second flat region and a plurality of second conduits. The plurality of second conduits being defined by a corresponding plurality of second discrete holes that reside in the head surface and extend through the second flat region. The head surface also including a third flat region disposed between and adjacent to the first flat region and the second flat region and a plurality of third conduits. The plurality of third conduits being defined by a corresponding plurality of third discrete holes that reside in the head surface and extend through the third flat region. The third conduits being formed at a first angle relative to the third flat region. The first angle being between 30 and 60 degrees.

The first conduits can be coupled to a first liquid source and provide the first liquid to the head surface. The second conduits can be coupled to a second fluid source and provide the second fluid to the head surface. The third conduits can be coupled to a vacuum source and provide a vacuum to the head surface. The third discrete holes can be formed along a trailing edge. The first conduits can be formed at a first angle relative to the first flat region, the second angle being between 30 and 60 degrees.

The first discrete holes can be formed in a first row, the second discrete holes can be formed in a second row and the third discrete holes can be formed in a third row. The first row, the second row and the third row being substantially parallel and wherein the third row can be disposed between the first row and the second row.

The second conduits can be formed at a second angle relative to the second flat region, the second angle being between 30 and 60 degrees, wherein the second conduits are directed away from the third row.

The proximity head can also include a fourth flat region being disposed on the opposing side of the first row from the third row. The fourth flat region being in a plane substantially parallel to and offset from the first flat region. The second row and the third row can be separated by a distance of between about 0.5 inches and about 0.75 inches.

The third flat region can be in a plane substantially parallel to and offset from the first flat region. The offset between the third flat region and the first flat region can be between about 0.020 inches to about 0.080 inches. The third row can be formed in the third flat region at the offset to the first flat region.

The third discrete holes can be chamfered. The proximity head can also include a first chamber coupled to the first conduits, a second chamber coupled to the second conduits and a third chamber coupled to the third conduits.

Another embodiment provides a proximity head including a head surface, the head surface including a first flat region and a plurality of first conduits. Each one of the first conduits being defined by corresponding one of a plurality of first discrete holes. The first discrete holes residing in the head surface and extending through the first flat region. The head surface also includes a second flat region and a plurality of second conduits. The second conduits being defined by a corresponding plurality of second discrete holes that reside in the head surface and extend through the second flat region. The head surface also includes a third flat region disposed between and adjacent to the first flat region and the second flat region and a plurality of third conduits. The third conduits being defined by a corresponding plurality of third discrete holes that reside in the head surface and extend through the third flat region. The third conduits being formed at a first angle relative to the third flat region. The first angle being between 30 and 60 degrees. The third discrete holes are formed along a trailing edge and a fourth flat region being disposed on the opposing side of the first row from the third row. The fourth flat region being in a plane substantially parallel to and offset from the first flat region. The third flat region being in a plane substantially parallel to and offset from the first flat region.

Yet another embodiment provides a method for a making a proximity head including forming a first chamber, a second chamber and a third chamber in a proximity head. Forming a plurality of first conduits from a head surface to the first chamber. Forming a plurality of second conduits from a head surface to the second chamber and forming a plurality of third conduits from a head surface to the third chamber, wherein the third conduits being formed at a first angle relative to the head surface, the first angle being between 30 and 60 degrees.

The method can also include forming a first flat region on the head surface, forming a second flat region on the head surface and forming a third flat region on the head surface. The third flat region being disposed between and adjacent to the first flat region and the second flat region. The third flat region being in a plane substantially parallel to and offset from the first flat region.

The method can also include forming a fourth flat region. The fourth flat region being in a plane substantially parallel to and offset from the first flat region. The proximity head can be formed from a single work piece.

Yet another embodiment provides a method of processing a substrate with a proximity head. The method includes placing a proximity head in close proximity to a surface of the substrate and in a first plane substantially parallel to the substrate surface, forming a liquid meniscus between a first flat region of a head surface of the proximity head and the substrate surface and applying a vacuum to a trailing edge of the liquid meniscus, wherein the vacuum draws a substantially continuous flow of liquid from the liquid meniscus. The liquid meniscus can include a leading edge and wherein the head surface can include a second flat region, the second flat region being in a plane substantially parallel to and offset from the first flat region, wherein the second flat region is offset to be nearer to the substrate surface than the first flat region and wherein the liquid meniscus includes a leading edge formed between the second flat region and the substrate surface.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for a proximity head will now be described. It will be apparent to those skilled in the art that the present invention may be practiced without some or all of the specific details set forth herein.

Various embodiments of the proximity head 100 are described in more detail in co-owned U.S. patent application Ser. No. 10/330,843 filed on Dec. 24, 2002 and entitled "Meniscus, Vacuum, EPA Vapor, Drying Manifold," and co-owned U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces." Various embodiments and applications of proximity heads are also described in co-owned U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,270, filed on Mar. 31, 2003, entitled "Vertical Proximity Processor," and U.S. patent application Ser. No. 10/404, 692 filed on Mar. 31, 2003, entitled Methods and Systems for Processing a Substrate Using a Dynamic Liquid Meniscus. The aforementioned patent applications are hereby incorporated by reference in their entirety.

Figure 1A:
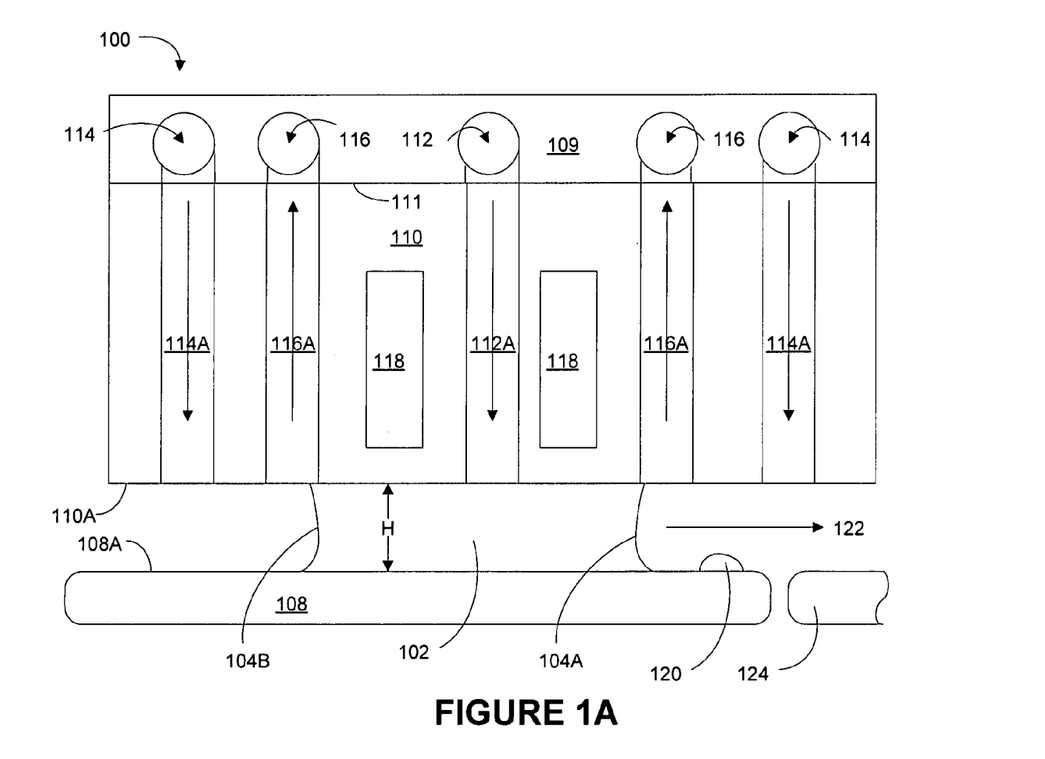
FIG. 1A illustrates a proximity head performing an operation on a surface of a substrate, in accordance with one embodiment of the present invention.

FIG. 1A illustrates a proximity head 100 performing an operation on a surface 108A of a substrate 108, in accordance with one embodiment of the present invention. The proximity head 100 can move relative to and while in close proximity to the top surface 108A of an item being processed 108. The item 108 being processed can be any type of item (e.g., a metal item, a ceramic, a plastic, a semiconductor substrate, or any other desired item). It should be appreciated that the proximity head 100 may also be utilized to process (e.g., clean, dry, etch, plate, etc.) a bottom surface 108B of the item 108.

The proximity head 100 includes one or more first conduits 112A for delivering a first fluid 112 to a head surface 110A of the proximity head. The proximity head 100 also includes one or more second conduits 114A for delivering a second fluid 114 to the head surface 110A. The second fluid 114 can be different than the first fluid 112 as will be discussed in more detail below. The proximity head 100 also includes multiple third conduits 116A for removing the first fluid 112 and the second fluid 116 from the head surface 110A.

Figure 1B:
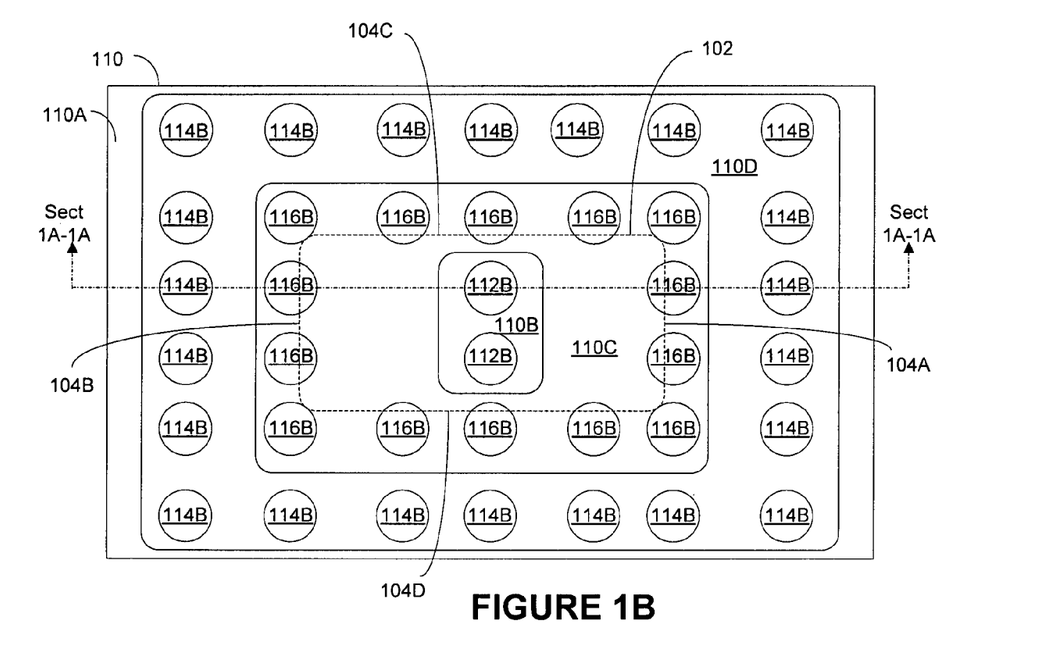
FIG. 1B is a view of the head surface of the proximity head, in accordance with an embodiment of the present invention.

FIG. 1B is a view of the head surface 110A of the proximity head 100, in accordance with an embodiment of the present invention. The head surface 110A includes substantially flat regions 110B, 110C, 110D. The substantially flat region 110B includes one or more discrete holes 112B that define the opening to one of the corresponding first conduits 112A. Similarly, the substantially flat region 110C. includes one or more discrete holes 114B that define the opening to one of the corresponding second conduits 114A and the substantially flat region 110D includes one or more discrete holes 116B that define the opening to one of the corresponding third conduits 116A. The discrete holes 112B, 114B and 116B can be any desirable shape (e.g., substantially round, elliptical, etc.), the same or different sizes. By way of example, the discrete holes 112B can be smaller or larger than discrete holes 114B and 116B.

It should be understood that the proximity head 100 described in FIGS. 1A and 1B is a simplified exemplary proximity head. The proximity head 100 can be in many different shapes and sizes. For example, the proximity head can be round, elliptical, annular and any other desired shape. Similarly, the meniscus 102 can be any desired shape as may be defined by the arrangement of the discrete openings 112B, 114B and 116B including but not limited to round, elliptical, rectangular, annular, concave, etc. Further the flat regions 110B, 110C and 110D can be any shape. By way of example, the flat region 110B can be circular, rectangular, elliptical or any other shape desired. The second flat region 110C including the third discrete holes 116B can fully encompass the flat region 110B or only a portion of the flat region 110B. Similarly, the third flat region 110D including the second discrete holes 114B can fully encompass the flat regions 110B and 110C or only a portion of the flat regions 110B and 110C By way of example, the second discrete holes 114B can be limited to only the trailing edge 104B and/or the leading edge 104A and/or one or more portions of the sides 104C and 104D, such as described in one or more of the above referenced co-pending applications which are incorporated by reference in their entirety for all purposes.

Figure 1C:
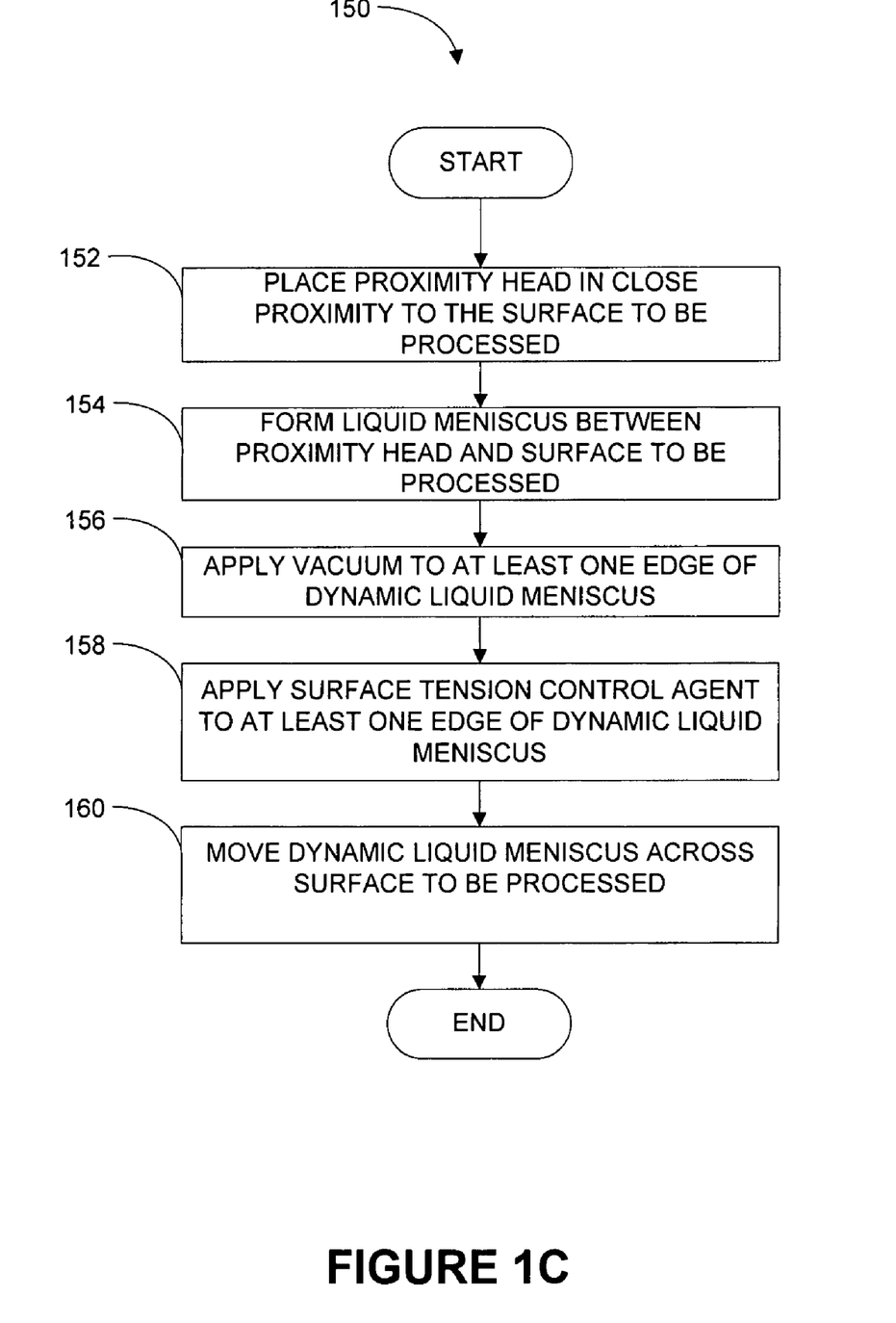
FIG. 1C is a flowchart of the method operations of processing a surface 108A, in accordance with an embodiment of the present invention.

FIG. 1C is a flowchart of the method operations 150 of processing a surface 108A, in accordance with an embodiment of the present invention. In an operation 152, the proximity head 100 is placed in close proximity to the substrate surface 108A for processing. The close proximity H as shown in FIG. 1A can be from about 5 mm to less than about 0.5 mm.

In an operation 154, a liquid 112 is output from one or more first conduits 112A and the corresponding discrete hole 112B to form a controlled, contained, liquid meniscus 102 between the head surface 110A and the substrate surface 108A. The surface tension of the liquid 112 causes the liquid to be "attached" or attracted to both the head surface 110A and the substrate surface 108A. As a result, the outer walls 104a, 104B of the meniscus 102 are formed as the surface of the liquid 112 is drawn between the head surface 110A and the substrate surface 108A. The liquid 112 can be any suitable liquid solution for the desired process. By way of example the liquid 112 can be water, de-ionized water (DIW), a cleaning fluid, an etching solution, a plating solution, etc.

In an operation 156, a vacuum is applied to one or more of the third conduits 116A. The vacuum draws the liquid 112 from the meniscus 102 into the discrete holes 116B and into the corresponding conduits 116A. The liquid 112 drawn from the meniscus 102 can be more or less than the amount of liquid flowing into the meniscus from the first conduits 112A. Bay way of example, there may be a greater number of third conduits 116A than there are first conduits 112A in the proximity head 100. Further, as the meniscus 102 is moved across the surface 108A, the meniscus can gather additional liquids and other contaminants from the surface.

Each one of the third conduits 116A and the corresponding discrete holes 116B can at least partially surround the first discrete holes 112B so that the proximity head 100 can contain the meniscus between the head surface 110A and the substrate surface 108A. A quantity of the first liquid 112 can flow through the meniscus to provide a very controlled processing of the substrate surface 108A. By way of example, the first liquid 112 can be an etching chemistry for etching the substrate surface 108A. As the etching chemistry reacts with the substrate surface 108A, the reaction residues become entrained in the etching chemistry and the resulting contamination could reduce the concentration and etching capability of the etching chemistry. As the etching chemistry 112A is drawn away from the meniscus 102 through the third conduits 116A, the reaction residues and other contamination are carried away from the meniscus. Simultaneously, additional non-contaminated etching chemistry is supplied to the meniscus 102 through the first conduits 112A.

In an operation 160, the proximity head 100 can be moved relative to the substrate 108 (e.g., in direction 122) so as to move the meniscus 102 along the substrate surface 108A. The side 104A forms a leading edge of the meniscus 102 as the meniscus moves along the substrate surface 108A in direction 122. The meniscus 102 can remove contaminants 120 that are on the substrate surface 108A. The contaminant 120 can be a liquid droplet, a solid residue or any other contaminants and combinations thereof (e.g., solid contaminates in a liquid solution).

The side 104B forms a trailing edge of the meniscus 102 as the meniscus moves along the substrate surface 108A in direction 122. The surface tension of the liquid in the meniscus 102 causes substantially all liquids on the substrate surface 108A to be removed with the meniscus. In this manner the meniscus 102 can perform a drying operation by removing all liquid contaminants from the substrate surface 108A. Similarly, the meniscus 102 can perform a dry-in-dry-out processing operation by applying a, for example, a wet etching or plating chemistry to the substrate surface 108A in the meniscus and the trailing edge 104B will remove all liquids from the etching or plating process.

Moving the meniscus 102 across the substrate surface 108A can also include moving the meniscus across the substrate surface and off the edge of the substrate surface to a second surface 124 as described in one or more of the above referenced co-pending patent applications.

In an optional operation 158, a second fluid 114 can be applied to the substrate surface 108A. The second fluid 114 can be a surface tension controlling fluid. The surface tension controlling fluid can be one or more of isopropyl alcohol (IPA) vapor, nitrogen, organic compounds, hexanol, ethyl glycol, $CO_2$ gas, and other compounds miscible with water or combinations thereof. By way of example an IPA vapor can be carried by an inert carrier gas, such as nitrogen, and carried to the substrate surface 108A.

The proximity head 100 does not physically contact the substrate 108. Only the first liquid 112 and the second fluid 114 contact the substrate 108.

The proximity head 100 can also include additional instruments or heaters or other monitors 118. The additional instruments or heaters or other monitors 118 can be used to monitor the liquid 112 or the process being applied to the substrate surface 108A by the meniscus 102. By way of example the additional instruments or heaters or other monitors 118 can heat or cool the 112 and measure the surface (e.g., thickness of a layer on the surface 108 or the thickness of the substrate 108 or a depth of a surface feature) or the concentration or other chemical aspects (e.g., ph level, conductivity, etc.) of the liquid 112 or any other aspect as desired. These embodiments are described in more detail in one or more of the above referenced co-pending applications.

Figure 1D:
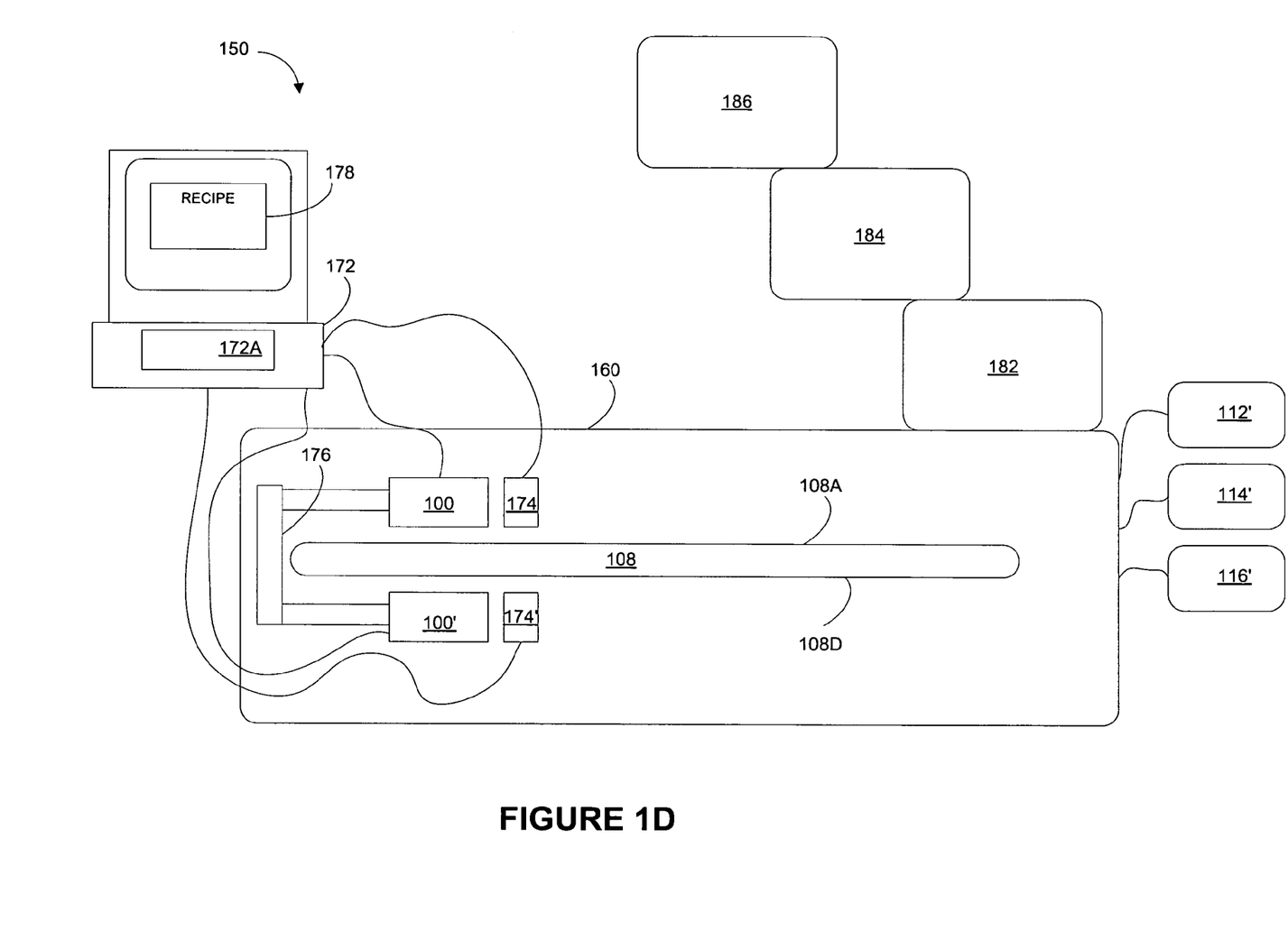
FIG. 1D is a simplified diagram of a proximity head system, in accordance with an embodiment of the present invention.

FIG. 1D is a simplified diagram of a proximity head system 170, in accordance with an embodiment of the present invention. The proximity head system 170 includes a process chamber 180, a controller 172, a vacuum source 116', a first liquid source 112', a second fluid source 114'. The first liquid source 112', the second fluid source 114, and the vacuum source 116' are coupled to the corresponding conduits 112, 114, 116 through appropriate control valves or other flow controlling mechanisms controlled by the controller 172.

The process chamber 180 can support more than one process. By way of example the process chamber 180 can support a plasma etching process and the proximity head 100 so that the plasma etching process can etch the item 108 and the proximity head can then rinse, clean and dry the item, insitu, within the single process chamber. The process chamber 180 can also be coupled to multiple other process chambers 182, 184, 186 such as are commonly referred to as a cluster tool.

The proximity head system 170 can also include a second proximity head 100' capable of processing a second surface 108B of the item 108. The proximity head system 170 can also include instruments 174 for monitoring the processes applied to the item 108. The proximity head system 170 can also include an actuator 176 coupled to the proximity head 100 and capable of supporting and/or moving the proximity head.

The controller 172 can also include a recipe 178. The recipe 178 defines the parameters of the processing in the process chamber. The controller 172 is coupled to the processing chamber 180 and the proximity head 100 and other portions of the processing chamber as needed for controlling the processing in the process chamber. The controller 172 also includes logic 172A for implementing the recipe 178 in the processes in the processing chamber 180. The logic 172A can also include the capability to monitor the results of the processes and adjust or modify one or more aspects of the recipe according to monitored results.

The item 108 can be moved relative to the proximity head 100. By way of example, the item can be a semiconductor wafer and can be rotated relative to the proximity head 100. Similarly, the item 108 can be substantially fixed in a single location and the proximity head 100 can be moved across the surface 108A of the item. It should also be understood that both the item 108 and the proximity head 100 can be movable. The relative motion of the proximity head 100 can be substantially, linear across the surface 108A or can be moved in a circular or spiral fashion. The motion of the proximity head 100 can be also be specifically moved from one location to another on the surface 108A as may be desired for a particular process being applied to the surface.

Figure 2A:
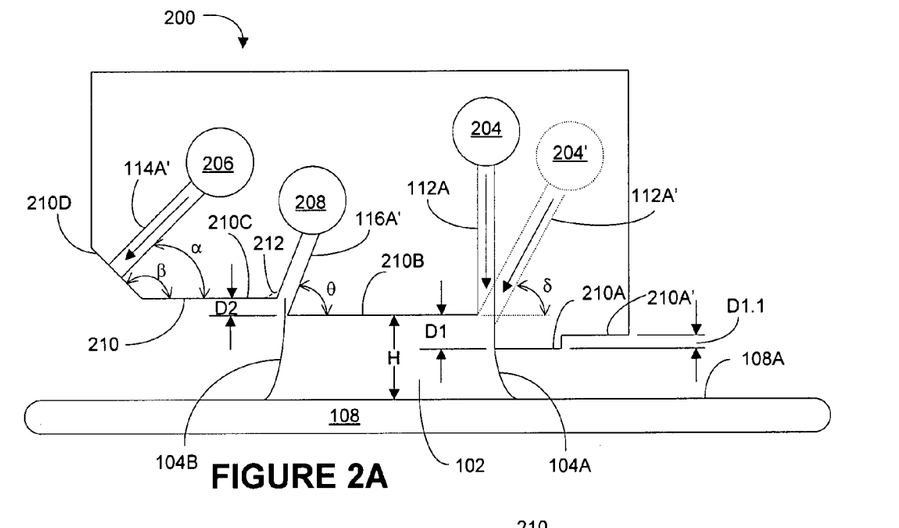
FIG. 2A is a cross-sectional view of a proximity head, in accordance with an embodiment of the present invention.
Figure 2B:
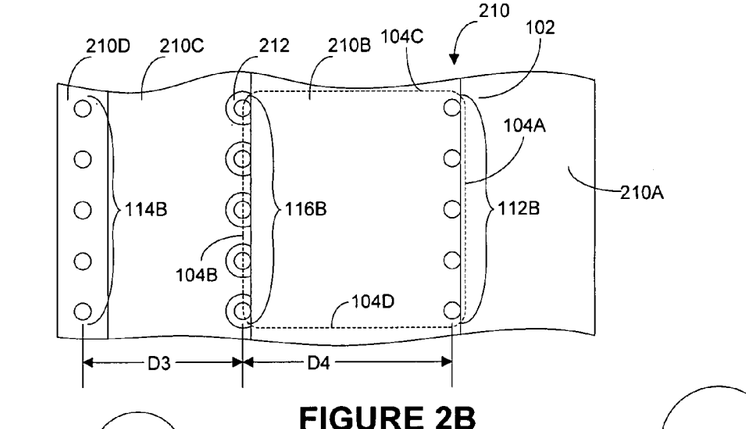
FIG. 2B is a view of the head surface of the proximity head, in accordance with an embodiment of the present invention.

FIG. 2A is a cross-sectional view of a proximity head 200, in accordance with an embodiment of the present invention. FIG. 2B is a view of the head surface 210 of the proximity head 200, in accordance with an embodiment of the present invention. The proximity head includes a first liquid chamber 204. The first conduits 112A connect the first discrete holes 112B to the first chamber 204. The first liquid source 112' is coupled to the first chamber 204 as described above. The first liquid chamber 204 distributes the first liquid 112 to the first conduits 112A and to the head surface 210 through the corresponding discrete holes 112B to form the meniscus 102 between the head surface and the substrate surface 108A.

The proximity head 200 also includes a second chamber 206 connected to the second discrete holes 114B by the second conduits 114A. The second fluid source 114' is coupled to the second fluid liquid supply chamber 206 as described above. The second chamber 206 distributes the second fluid 114 to the second conduits 114A and to the head surface 210 through the corresponding discrete holes 114B.

The proximity head 200 also includes a third chamber 208 connected to the discrete holes 116B by the third conduits 116A. The vacuum source 116' is coupled to the third supply chamber 208 as described above. The third chamber 208 distributes a vacuum to the third conduits 116A and to the head surface 210 through the corresponding discrete holes 116B. The vacuum can draw the first liquid 112 and the second fluid 114 the head surface 210 (e.g., from the meniscus 102 and/or from the space between the head surface 210 and the substrate surface 108A).

Figure 2C:
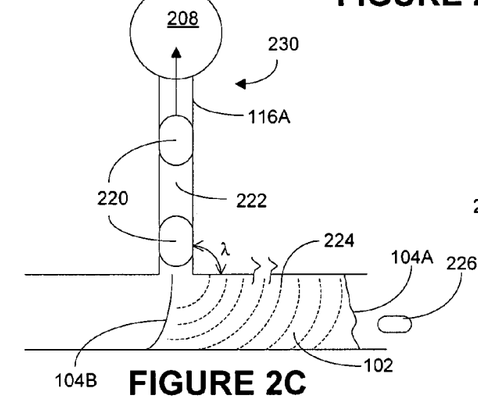
FIG. 2C shows a more detailed view of the third conduits and the third chamber 208, in accordance with an embodiment of the present invention.

FIG. 2C shows a more detailed view 230 of the third conduits 116A and the third chamber 208, in accordance with an embodiment of the present invention. The third conduits 116A are formed substantially perpendicular (i.e., angle λ is equal to about 90 degrees) to the head surface 210. The third conduits 116A have a diameter of between about 0.5 mm and about 2.0 mm (i.e., about 0.020" and about 0.80"). In operation, the vacuum draws the liquid into the third conduits 116A and due to the relatively small diameter the liquid adheres to the sides of the conduit forming multiple small quantities of liquid 220. The multiple small quantities of liquid 220 are drawn from the meniscus 102 interspersed with pockets 222 of the immediate atmosphere around the meniscus. As a result, the air flow created by the vacuum present in the third chamber 208 is intermittently interrupted by each one of the multiple small quantities of liquid 220 in the third conduit 116A. Therefore the air flow is periodically interrupted and the vacuum is not continuously and uniformly applied to the meniscus 102.

The interruptions in the vacuum results in pressure fluctuations 224 that are disseminated throughout the meniscus 102. The pressure fluctuations can burst the leading edge 104A of the meniscus 102 causing liquid droplets 226 to be expelled from the meniscus 102.

Referring to the proximity head 100 described in FIGS. 1A and 1B above, the vacuum is applied substantially around the circumference of the meniscus 102. As a result, any droplets (e.g., such as droplets 226 shown in FIG. 2C) that are expelled from one or more edges 104A-104D of the meniscus 102 are quickly collected by the vacuum. Unfortunately, the applying the vacuum substantially around the circumference of the meniscus 102 requires a very complex vacuum distribution system within the proximity head. The complex distribution system has required the proximity head 100 be manufactured in several layers and many parts. For example, the head surface 110A and facia block 110 are formed as shown in FIGS. 1A and 1B. The vacuum distribution system is formed in one or more additional blocks 109 that are then mechanically sealed to the top surface 111 of the facia block 110 to form the completed proximity head. Depending on the precise application, the proximity head 100 can include multiple parts, seals to distribute, manage and seal the various liquids, fluids and vacuum within the proximity head.

Figure 2D:
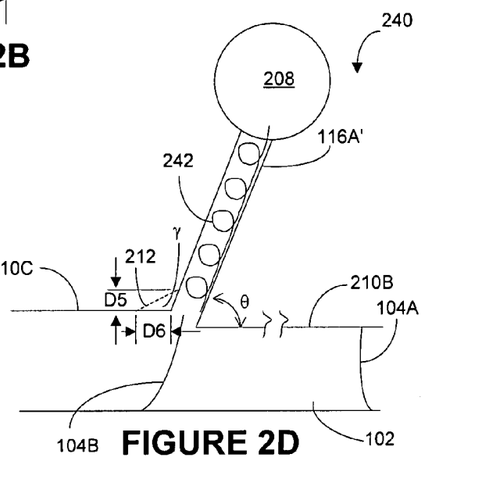
FIG. 2D shows a more detailed view of the third conduits and the third chamber 208, in accordance with an embodiment of the present invention.

FIG. 2D shows a more detailed view 240 of the third conduits 116A' and the third chamber 208, in accordance with an embodiment of the present invention. The third conduits 116A' are formed at an angle $\theta$ to the head surface 210. $\theta$ is less than 90 degrees and can be between about 15 and about 60 degrees from the head surface 210. By way of example, the third conduits 116A' can be formed at an angle of about 30 degrees to the head surface 210.

Forming the third conduits 116A' at an angle less than 90 degrees to the head surface causes the liquid to be drawn up the conduits in a more spiral fashion 242 rather than the segmented fashion 220 described above in FIG. 2C. As the liquid is drawn up the conduits 116A' the liquid moves substantially continuously up the conduits 116A' and into the third chamber 208. Therefore the air flow is not interrupted and vacuum pressure remains unchanged and the meniscus 102 is not disrupted and no droplets are expelled from the meniscus. As a result, the proximity head 200 does not require a vacuum along the leading edge 104A of the meniscus 102. Therefore, the proximity head 200 can be manufactured from a single block of material.

As the liquid moves substantially continuously up the conduits 116A' less force is needed to draw the liquid into the conduits 116A'. The reduced force correlates to a lower vacuum level. By way of example, a proximity head with substantially perpendicular conduits 116A (as shown in FIG. 2C) requires a vacuum level of between about 130 mm and 180 mm of mercury. In comparison, the continuous flow provided by the angled conduits 116A' requires between about 60 mm and about 100 mm of mercury.

Figure 2E:
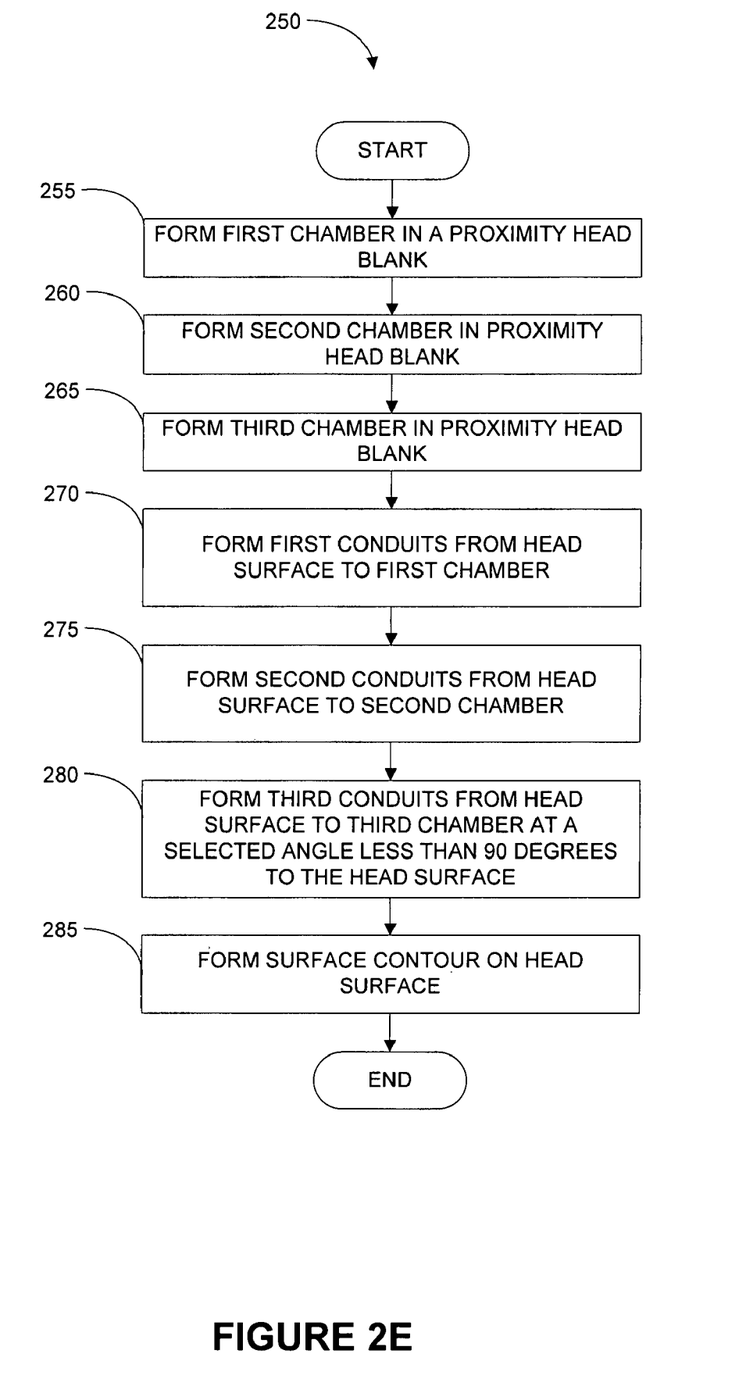
FIG. 2E is a flowchart of the method operations of forming the proximity head, in accordance with an embodiment of the present invention.

FIG. 2E is a flowchart of the method operations 250 of forming the proximity head 200, in accordance with an embodiment of the present invention. In an operation 255, a proximity head blank (e.g., a single block of material) is selected and the first chamber 204 is formed in the proximity head blank. The proximity head blank can be any suitable material (e.g., a plastic, ceramic, metal, glass, etc.) that is suitable for the processing environment and the chemistry being applied during the processing and capable of maintaining the shape and size during manufacturing and use in the processing. By way of example the proximity head 200 can be formed from stainless steel or PTFE (commonly referred to at Teflon) or any other suitable material.

In an operation 260, the second chamber 206 is formed in the proximity head blank and in operation 265 the third chamber 208 is formed in the proximity head blank. The first chamber 204, the second chamber 206 and the third chamber 208 can be formed in the proximity head blank by machining (e.g., mill or drill, etc.) or by molding or casting or any other suitable manufacturing method.

In operations 270, 275 and 280, respectively, the first conduits 112A, the second conduits 114A and the third conduits 116A' are formed in the proximity head blank. The first conduits 112A, the second conduits 114A and the third conduits 116A' can be formed by appropriate machining processes (e.g., drill or milling or combinations thereof. By way of example the first conduits 112A, the second conduits 114A and the third conduits 116A' can be formed by drilling the corresponding discrete holes 112B, 114B and 116B in the head surface at the corresponding desired angles (e.g., $\theta$, $\alpha$).

In an operation 285, the precise contour of the head surface 210 is formed on the proximity head. The head surface 210 can be formed by any suitable means (e.g., molding, machining, cutting, etc.).

Referring again to FIGS. 2A, 2B and 2D, the head surface 210 have many features. The head surface 210 includes multiple flat regions 210A, 210A', 210B, 210C and 210D. The second flat region 210B is the portion of the head surface 210 in contact with most of the meniscus 102. The meniscus 102 has a thickness H of between about 0.25 mm and about 5.0 mm (i.e., 0.010" to about 0.200").

The first flat region 210A is offset from and in a plane substantially parallel to the second flat region 210B. The offset is a distance D1 of between about 0.25H to about 0.5H so that first flat region 210A is closer to the substrate surface 108A than the second flat region 210B. Having the first flat region 210A closer to the substrate surface 108A while in operation results in the leading edge 104A being physically shorter than the trailing edge 104B (e.g., the trailing edge has a length of about H where the leading edge has a length of 0.5H to 0.75H). As a result, the adhesion forces that form the leading edge 104A are substantially stronger and therefore the leading edge is correspondingly stronger and more robust. This robustness further reduces the need for a vacuum along the leading edge 104A to maintain the leading edge.

The proximity head 200 does not have any second conduits 114A and second discrete holes 114B along the leading edge and therefore uses less of the second fluid 114. The lack of second discrete holes 114B and the second fluid 114 and the lack of vacuum along the leading edge 104A reduces any premature drying that may occur ahead of the leading edge 104A. By way of example, referring to the proximity head in FIGS. 1A and 1B the second fluid 114 flowing from the conduit 114A ahead of the leading edge 104A can dry the droplet 120 before the leading edge 104A can consume the droplet.

The additional flow of the atmosphere into the vacuum conduits 116A at the leading edge of the meniscus can also increase the atmosphere flowing over the droplet 120 and therefore dry the droplet at least partially, before the leading edge 104A can consume the droplet. Eliminating one or both of the vacuum 116 and second fluid 114 that are applied to the substrate surface 108A ahead of the leading edge 104A will reduce the drying of the droplet 120. Drying the droplet 120 is not desirable because contaminants within the droplet will be deposited on the substrate surface 108A. This is especially important were previous process is a wet process (e.g., clean, or other chemical processes without a drying step) and the proximity head is applied to rinse and/or dry the substrate surface 108A.

Figure 3:
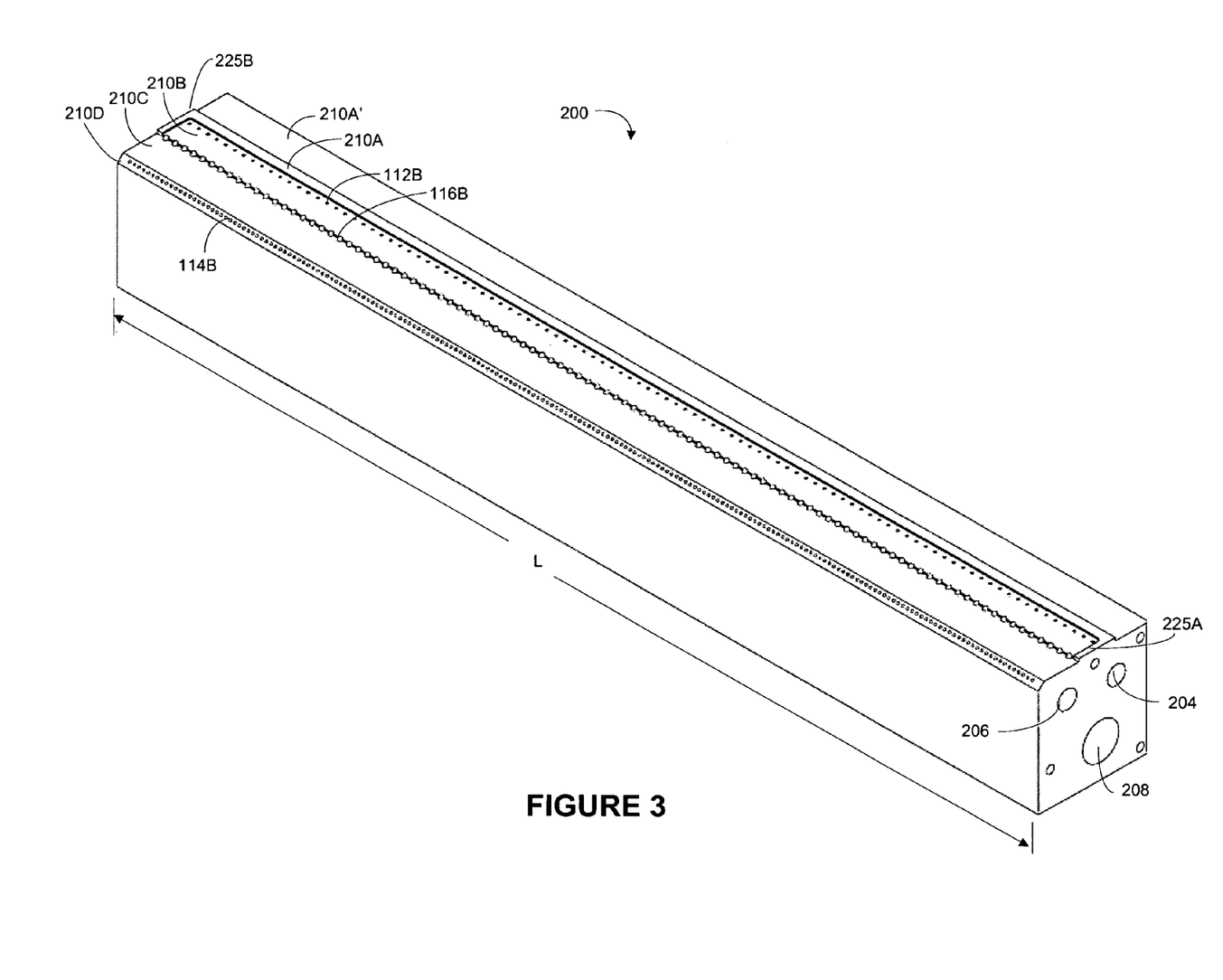
FIG. 3 is an isometric view of the proximity head, in accordance with an embodiment of the present invention.

FIG. 3 is an isometric view of the proximity head 200, in accordance with an embodiment of the present invention. As shown in FIG. 3, the first flat region 210A can be extended around the ends 225A and 225B of the first discrete holes 112B. Extending the first flat region 210A around the ends 225A and 225B of the first discrete holes 112B further simplifies the structure of the proximity head 200 as no vacuum needs to be applied to maintain the sides 104C and 104D of the meniscus 102 and therefore no third conduits 116A, third discrete holes 116B and third chamber is needed in the area of the sides 104C and 104D of the meniscus.

Referring again to FIGS. 2A, 2B and 2D, a portion 210A' of the first flat region 210A can optionally be offset from and in a plane substantially parallel to the first flat region. The portion 210A' offset from the first flat region 210A can assist in forming the leading edge 104A and sides 104C and 104D of the meniscus as the leading edge and sides will form on the first flat region as it is closer to the substrate surface 108A. The portion 210A' is offset a distance of D1.1 from the first flat region 210A. Distance D1.1 can be between about 0.25 to about 1.0 mm (i.e., about 0.010" to about 0.040").

The third flat region 210C can optionally be offset from and in a plane substantially parallel to the second flat surface region 210B. The third flat region 210C is offset a distance D2 from the second flat surface region 210B. D2 can be between about 0.5 mm to about 2.0 mm (0.020" to about 0.080"). The offset of the third flat region 210C assists in defining the location of the trailing edge 104B of the meniscus 102 by aiding the flow into the discrete holes 116B. The offset increases the distance and volume of space between the third flat region 210C and the substrate surface 108A. The increased space allows more of the immediate atmosphere and the fluid 114 access to and to flow into the discrete holes 116B. The additional flow of the immediate atmosphere and the fluid 114 into the discrete holes 116B assists in the spiral flow 242 of the liquid carried into the discrete holes 116B by the vacuum.

Each of the discrete holes 116B can also include a chamfer 212. The chamfer 212 further smoothes flow of the liquid from the meniscus 102 into the discrete holes 116B. The chamfer 212 can be any suitable size and shape. By way of example, the chamfer 212 is shown as being substantially concentric with the discrete holes 116B. Alternatively, the chamfer 212 can be more elliptical and extending towards the discrete holes 114B.

The chamfer 212 can be any suitable width D6 around the discrete holes 116B. By way of example D6 can be between about 0.015" and about 0.040". The chamfer 212 can have a depth D5 of between about 0.005" and about 0.020". The chamfer 212 can have an angle γ of between about 30 and about 60 degrees. By way of example, the chamfer 212 can have a width D6 of about 0.015" around each of the discrete holes 116B and a depth D5 of about 0.015" and an angle γ of about 45 degrees.

The second conduits 114A' can be formed at an angle α to the third flat region 210C. The angle α can be between about 30 degrees and about 60 degrees. The angle α directs the second fluid 114 away from the vacuum 116 applied to the third conduits 116A', as a result, the second fluid 114 resides in the volume between the third flat region 210C and the substrate surface 108A for a longer time. The longer time allows more time for the second fluid 114 to act on the interface between the trailing edge 104B and the substrate surface 108A. Recall from above that the second fluid 114 can be a gas a vapor or a mixture of gases and vapors (e.g., an IPA/N2 vapor and gas mixture, carbon dioxide gas, etc.) for modifying the surface tension of the liquid 112 in the meniscus 102. The second fluid 114 mixes more with the local atmosphere if the discrete holes 114B are somewhat more remote from the vacuum discrete holes 116B. Mixing the second fluid 114 with the local atmosphere provides a more uniform delivery of the second fluid 114 and therefore a more uniform modification of the surface tension of the trailing edge 104B of the meniscus 102.

The discrete holes 114B and the discrete holes 116B are separated by a distance D3. Distance D3 can be between about 0.5" and about 0.75". Similar to the angle α described above, the distance D3 helps determine the residence time of the second fluid in the volume between the third flat region 210C and the substrate surface 108A. As distance D3 is reduced, the residence time is also reduced. Alternatively, as distance D3 is increased, the residence time is also increased.

The proximity head 200 can be scanned over the substrate surface 108A at a scanning speed of between about 0.2 inches and about 0.6 inches per second. This provides a residence time for the second fluid 114 of between about 0.8 and about 3.75 seconds. For comparison, the proximity head 100 (shown in FIG. 1A) provides a residence time of between about 0.15 and about 0.75 seconds (e.g., about a factor of 5).

The fourth flat region 210D can be co-planar with the third flat region 210C. Alternatively, the fourth flat region 210D can be angled at an angle β to the third flat region 210C. Angle θ can be between about 30 degrees and about 60 degrees. The angle θ can be between about 120 and about 180 degrees.

The discrete holes 112B and the discrete holes 116B are separated by a distance D4. Distance D4 can be between about 0.25" and about 2.0". The distance D4 is slightly less than the distance between the leading edge 104A and the trailing edge 104B of the meniscus 102.

Referring to FIG. 2A, the first conduits 112A' (shown in phantom) can optionally be formed at angle δ to the second flat region 210B. Angle δ can be between about 30 degrees and about 90 degrees. Angling the conduit 112A' toward the discrete holes 116B promotes and aids in the flow of the first liquid 112 from the conduit 112A' into the meniscus 102 and into the discrete holes 116B.

Figure 4:
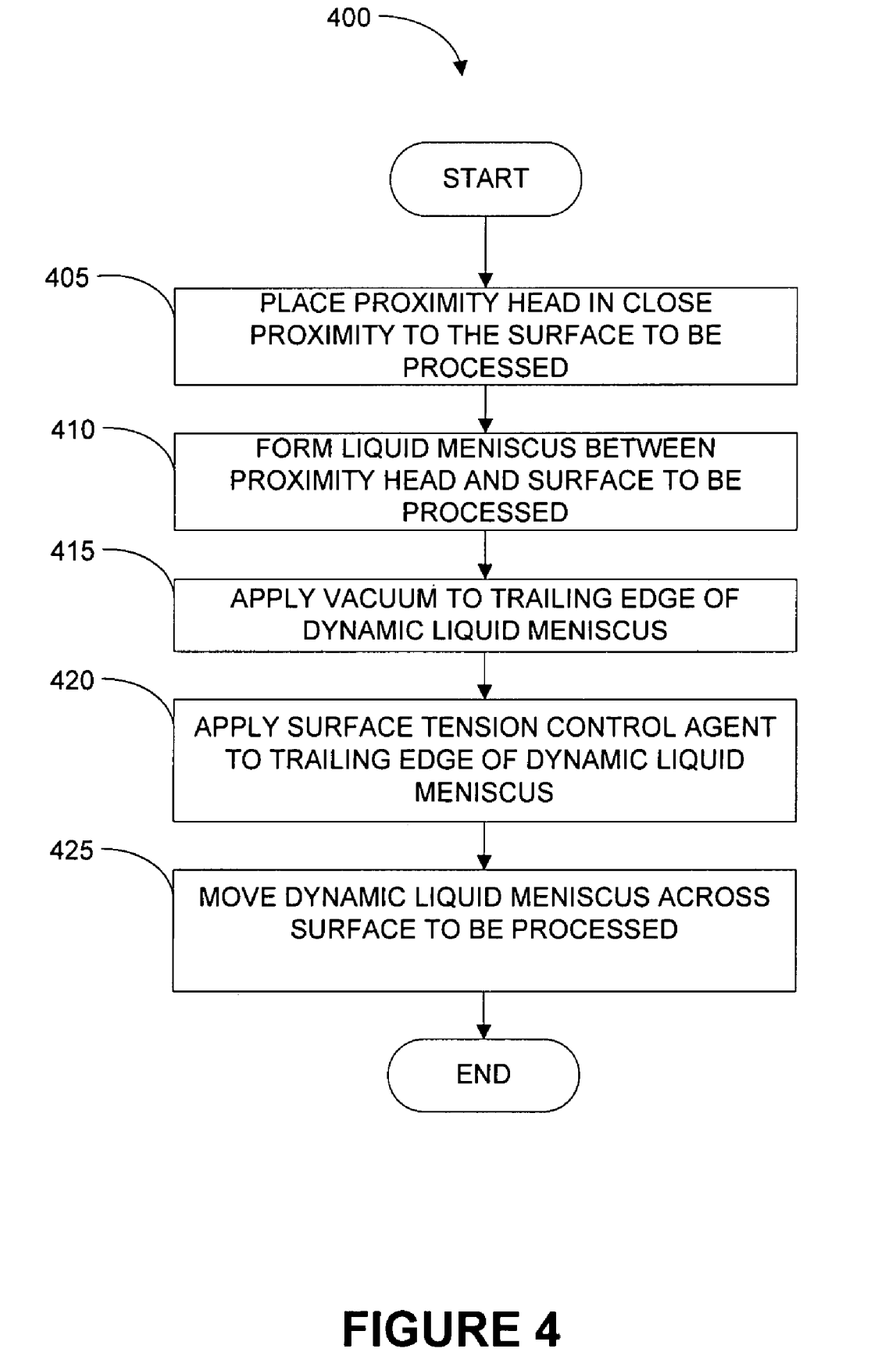
FIG. 4 is a flowchart of the method operations of processing a surface, in accordance with an embodiment of the present invention.

FIG. 4 is a flowchart of the method operations 400 of processing a surface 108A, in accordance with an embodiment of the present invention. In an operation 405, the proximity head 200 is placed in close proximity to the substrate surface 108A for processing.

In an operation 410, a liquid 112 is output from one or more first conduits 112A and the corresponding discrete hole 112B to form a controlled, contained, liquid meniscus 102 between the head surface 210 and the substrate surface 108A. As described above the liquid 112 can be delivered via an angled first conduits 112A' which directs the first liquid toward the discrete holes 116B.

In an operation 415, a vacuum 116 is applied to one or more of the angled third conduits 116A'. The vacuum 116 draws the liquid 112 from the meniscus 102 into the discrete holes 116B and into the corresponding conduits 116A'. As described above the liquid 112 flows substantially continuously through the conduits 116A'.

In an optional operation 420, a second fluid 114 can be applied to the substrate surface 108A along the trailing edge 104B of the meniscus. In an operation 425, the proximity head 200 can be moved relative to the substrate 108 so as to move the meniscus 102 along the substrate surface 108A and the method operations can end.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

Aspects of the invention can also be embodied as computer readable code and/or logic on a computer readable medium. By way of examples the recipe 178 and the method operations described in the flow charts. The computer readable medium is any data storage device that can store data which can thereafter be read by a computer system. Examples of the computer readable medium include hard drives, network attached storage (NAS), logic circuits, read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A proximity head comprising:
   a head surface, the head surface including:
      a first flat region and a plurality of first conduits, each one of the plurality of first conduits being defined by corresponding one of a plurality of first discrete holes, the plurality of first discrete holes residing in the head surface and extending through the first flat region;
      a second flat region and a plurality of second conduits, the plurality of second conduits being defined by a corresponding plurality of second discrete holes that reside in the head surface and extend through the second flat region; and
      a third flat region disposed between and adjacent to the first flat region and the second flat region, a plurality of third conduits, the plurality of third conduits being defined by a corresponding plurality of third discrete holes that reside in the head surface and extend through the third flat region wherein the third conduits being formed at a first angle relative to the third flat region, the first angle being angled toward the first conduits, the first angle being between 30 and 60 degrees.

2. The proximity head of claim 1, wherein the first conduits are coupled to a first liquid source and provide the first liquid to the head surface, wherein the plurality of second conduits are coupled to a second fluid source and provide the second fluid to the head surface and wherein the plurality of third conduits are coupled to a vacuum source and provide a vacuum to the head surface.

3. The proximity head of claim 1, wherein the third discrete holes are formed along a trailing edge.

4. The proximity head of claim 1, wherein the first conduits being formed at a second angle relative to the first flat region, the second angle being between 30 and 60 degrees.

5. The proximity head of claim 1, wherein the first discrete holes are formed in a first row and wherein the second discrete holes are formed in a second row and wherein the third discrete holes are formed in a third row, the first row, the second row and the third row being substantially parallel and wherein the third row is disposed between the first row and the second row.

6. The proximity head of claim 5, wherein the second conduits being formed at a second angle relative to the second flat region, the second angle being between 30 and 60 degrees, wherein the second conduits are directed away from the third row.

7. The proximity head of claim 5, further comprising a fourth flat region being disposed on the opposing side of the first row from the third row, the fourth flat region being in a plane substantially parallel to and offset from the first flat region.

8. The proximity head of claim 5, wherein the second row and the third row are separated by a distance of between about 0.5 inches and about 0.75 inches.

9. The proximity head of claim 5, wherein the third flat region being in a plane substantially parallel to and offset from the first flat region.

10. The proximity head of claim 9, wherein the offset between the third flat region and the first flat region is between about 0.020 inches to about 0.080 inches.

11. The proximity head of claim 10, wherein the third row is formed in the third flat region at the offset to the first flat region.

12. The proximity head of claim 1, wherein the third discrete holes are chamfered.

13. The proximity head of claim 1, further comprising a first chamber coupled to the first conduits, a second chamber coupled to the second conduits and a third chamber coupled to the third conduits.

14. A proximity head comprising:
   a head surface, the head surface including:
      a first flat region and a plurality of first conduits, each one of the plurality of first conduits being defined by corresponding one of a plurality of first discrete holes, the plurality of first discrete holes residing in the head surface and extending through the first flat region;
      a second flat region and a plurality of second conduits, the plurality of second conduits being defined by a corresponding plurality of second discrete holes that reside in the head surface and extend through the second flat region; and
      a third flat region disposed between and adjacent to the first flat region and the second flat region, a plurality of third conduits, the plurality of third conduits being defined by a corresponding plurality of third discrete holes that reside in the head surface and extend through the third flat region wherein the third conduits being formed at a first angle relative to the third flat region, the first angle being angled toward the first conduits, the first angle being between 30 and 60 degrees, wherein the third discrete holes are formed along a trailing edge, a fourth flat region being disposed on the opposing side of the first row from the third row, the fourth flat region being in a plane substantially parallel to and offset from the first flat region, wherein the third flat region being in a plane substantially parallel to and offset from the first flat region.

15. The proximity head of claim 14, wherein each one of the plurality of third discrete holes have a trailing edge that is in the third flat region and a leading edge that is in the first flat region.

16. The proximity head of claim 14, wherein the offset increases a distance between the third flat region and the substrate surface.

17. The proximity head of claim 1, wherein each one of the plurality of third discrete holes have a trailing edge that is in the third flat region and a leading edge that is in the first flat region, the third flat region being in a plane substantially parallel to and offset from the first flat region, wherein the offset increases a distance between the third flat region and the substrate surface.

\* \* \* \* \*